US007423390B2

(12) United States Patent
Sato

(10) Patent No.: US 7,423,390 B2
(45) Date of Patent: Sep. 9, 2008

(54) ELECTRON BEAM GENERATOR FOR MULTIPLE COLUMNS

(75) Inventor: Takamasa Sato, Tokyo (JP)

(73) Assignee: Advantest Corp., Tokyo (JP)

( * ) Notice: Subject to any disclaimer, the term of this patent is extended or adjusted under 35 U.S.C. 154(b) by 57 days.

(21) Appl. No.: 11/703,848

(22) Filed: Feb. 8, 2007

(65) Prior Publication Data

US 2007/0296343 A1 Dec. 27, 2007

(30) Foreign Application Priority Data

Feb. 23, 2006 (JP) ............................ 2006-046578

(51) Int. Cl.
*H01J 37/06* (2006.01)

(52) U.S. Cl. ...................................... 315/381; 315/500

(58) Field of Classification Search ............ 315/111.31, 315/111.41, 111.61, 111.81, 500; 250/423 R, 250/424, 425, 426, 427

See application file for complete search history.

(56) References Cited

U.S. PATENT DOCUMENTS 5,557,105 A 9/1996 Honjo et al.
5,841,235 A * 11/1998 Engelko et al. ........ 315/111.21
6,727,658 B2 * 4/2004 Ooae et al. ............... 315/169.1
7,321,198 B2 * 1/2008 Kubota et al. .......... 315/111.31

FOREIGN PATENT DOCUMENTS

JP 2005-026241 1/2005

* cited by examiner

*Primary Examiner*—David H Vu
(74) *Attorney, Agent, or Firm*—Muramatsu & Associates

(57) ABSTRACT

An electron beam generator for multiple columns includes: a plurality of cathodes, to which a single acceleration voltage supply applies a negative acceleration voltage, and which thus generates thermoelectrons; a grid for each of the plurality of cathodes, the grid converging the thermoelectrons emitted to form a beam of electrons; a grid voltage supply for giving the grid a potential which is negative relative to a potential of the cathode; and a control circuit for each cathode, for controlling the potential of the grid. The control circuit includes a current direction restricting element connected between a positive electrode of the grid voltage supply and the cathode, and a grid current supplied from the grid voltage supply is caused to flow to the cathode through the current direction restricting element.

6 Claims, 7 Drawing Sheets

ELECTRON BEAM GENERATOR FOR MULTIPLE COLUMNS

CROSS-REFERENCE TO RELATED APPLICATIONS

This application is based on and claims priority of Japanese Patent Application No. 2006-46578 filed on Feb. 23, 2006, the entire contents of which are being incorporated herein by reference.

BACKGROUND OF THE INVENTION

1. Field of the Invention

The present invention relates to an electron beam generator, and specifically to an electron beam generator for multiple columns, which is used in each of multiple columns where beams of electrons are used respectively.

2. Description of the Prior Art

An electron beam exposure system of a conventional type is configured to generate a single beam of electrons by use of a single acceleration voltage in a single column. Because of this configuration, the electron beam exposure system of the conventional type has a disadvantage that drawing throughput is slow.

For the purpose of solving this disadvantage, study has been made for a multiple-electron-beam exposure system which performs drawing through generating a plurality of beams of electrons from a single beam of electrons accelerated by an acceleration voltage. The multiple-electron-beam exposure system is capable of simultaneously transferring a plurality of drawing patterns on a workpiece by irradiation, and aims at enhancing throughput.

As a technology concerned with this, Japan Patent Laid-open Official Gazette No. 2002-164009 has disclosed an electron beam generator which generates a plurality of beams of electrons from a single beam of electrons for the purpose of increasing a production rate at which semiconductor elements and the like are produced.

What is required of an electron beam exposure system is an increased drawing throughput, and a capability of drawing fine patterns with a higher precision.

As a technology concerned with this, Japan Patent Laid-open Official Gazette No. Hei. 5-251315 has disclosed an electron beam exposure system which adjusts properties of a plurality of beams of electrons individually, and which thus arranges spot shapes respectively of the plurality of beams of electrons with a higher precision.

In addition, Japan Patent Laid-open Official Gazette No. 2005-26241 has disclosed an electron beam generator which is capable of controlling electric current amounts respectively of the beams of electrons with a higher precision by use of a self-bias resistance, and which thus supplies a stable emission electric current.

FIG. 1 shows a diagram of a schematic configuration of the electron beam generator using the self-bias resistance, which has been disclosed in Japan Patent Laid-open Official Gazette No. 2005-26241. The electron beam generator includes a cathode 1, a grid 2, a filament electric current supply 7, a cathode power supply 4, a self-bias resistance 3, a cathode voltage detector 6 and a cathode controller 5. The cathode 1 generates thermoelectrons. The grid 2 converges the thermoelectrons, and thus forms a beam of electrons. The filament electric current supply 7 heats the cathode 1, and thereby causes the cathode 1 to generate the thermoelectrons. The cathode power supply 4 applies a voltage to the cathodel, and thereby causes the cathodes 1 to emit the thermoelectrons. The self-bias resistance 3 changes the electric potential of the grid 2 relative to the electric potential of the cathode 1. The cathode voltage detector 6 detects the voltage between the electric potential of the cathode 1 and the reference electric potential (earth electric potential). The cathode controller 5 controls the voltage which the cathode power supply 4 applies to the cathode 1 on the basis of the detected voltage.

In the case of the electron beam generator with the foregoing configuration, the thermoelectrons emitted from the cathode 1 constituting an electron gun are accelerated by the voltage applied to the cathode power supply 4. Thus, an emission electric current is generated. When the emission electric current suddenly changes due to discharge or the like, electric potential drop occur between the two ends of the self-bias resistance 3. This electric potential drop causes the electric potential of the grid 2 to change. Thereby, the electric current value of the emission electric current is designed to be inhibited from changing.

As described above, control is made to inhibit the change in the emission electric current, and thereby the emission electric current is stabilized. However, the technology disclosed in Japan Patent Laid-open Official Gazette No. 2005-26241 is intended to deal with a single-column electron beam exposure system, and accordingly no examination has been given to a method of inhibiting change of emission electric current in the multiple-column electron beam exposure system to be intended to increase throughput. As a result, it is unclear whether or not the method adopted for the single-column electron beam exposure system can be adopted to the multiple-column electron exposure system.

SUMMARY OF THE INVENTION

The present invention has been made in view of the foregoing problems with the prior art. An object of the present invention is to provide an electron beam generator for multiple columns, which is capable of being controlled so as to emit a stable beam of electrons corresponding to change of an emission electric current.

The foregoing problems are solved by an electron beam generator for multiple columns, which is characterized by including a plurality of cathodes as well as a grid, a grid voltage supply and a control circuit for each of the plurality of cathodes. A negative acceleration voltage is applied to the plurality of cathodes by a single acceleration voltage supply, and thus each of the plurality of cathodes generates thermoelectrons. The grid converges the thermoelectrons, which have been emitted from a corresponding one of the plurality of cathodes. The grid voltage supply gives the grid an electric potential, which is negative relative to a potential of the cathode. The control circuit is connected to the acceleration voltage supply, and controls the electric potential of the grid. The electron beam generator for multiples columns is also characterized in that the control circuit includes an electric current direction restricting element connected between the positive electrode of the grid voltage supply and the cathode, and in that the control circuit causes a grid electric current, which is supplied from the grid voltage supply, to the cathode through the electric current direction restricting element.

In the case of the electron beam generator for multiple columns according to this embodiment, the control circuit may further include: a voltage detector for detecting a voltage between the cathode and the grid; and a grid voltage controller for controlling a value of the grid voltage supply on the basis of the voltage detected by the voltage detector. When the grid voltage controller determines that the voltage between the cathode and the grid fluctuates, the grid voltage controller may change the value of the grid voltage supply so as to inhibit the fluctuation. The control circuit may further include a self-bias resistance which is connected between the negative electrode of the acceleration voltage supply and the cathode. When the emission electric current increases due to the thermoelectrons emitted from the cathode, the control circuit may adjust the electric potential of the grid so as to decrease the emission electric current.

In the case of the present invention, when the voltage between the cathode and the grid fluctuates and accordingly the emission electric current fluctuates, the adjustment is designed to be made so that the value of the grid voltage supply is changed so as to inhibit the fluctuation. This adjustment fluctuates the grid electric current. By connecting the diode between the grid voltage supply and the cathode, however, the grid electric-current is designed to be prevented from flowing to the self-bias resistance which is common among all of the columns. This makes it possible to change the grid voltage so as to inhibit the change in the voltage between the cathode and the grid in each column independently of the other columns, and to thus supply a stable emission electric current.

DESCRIPTION OF THE PREFERRED EMBODIMENT

Figure 1:
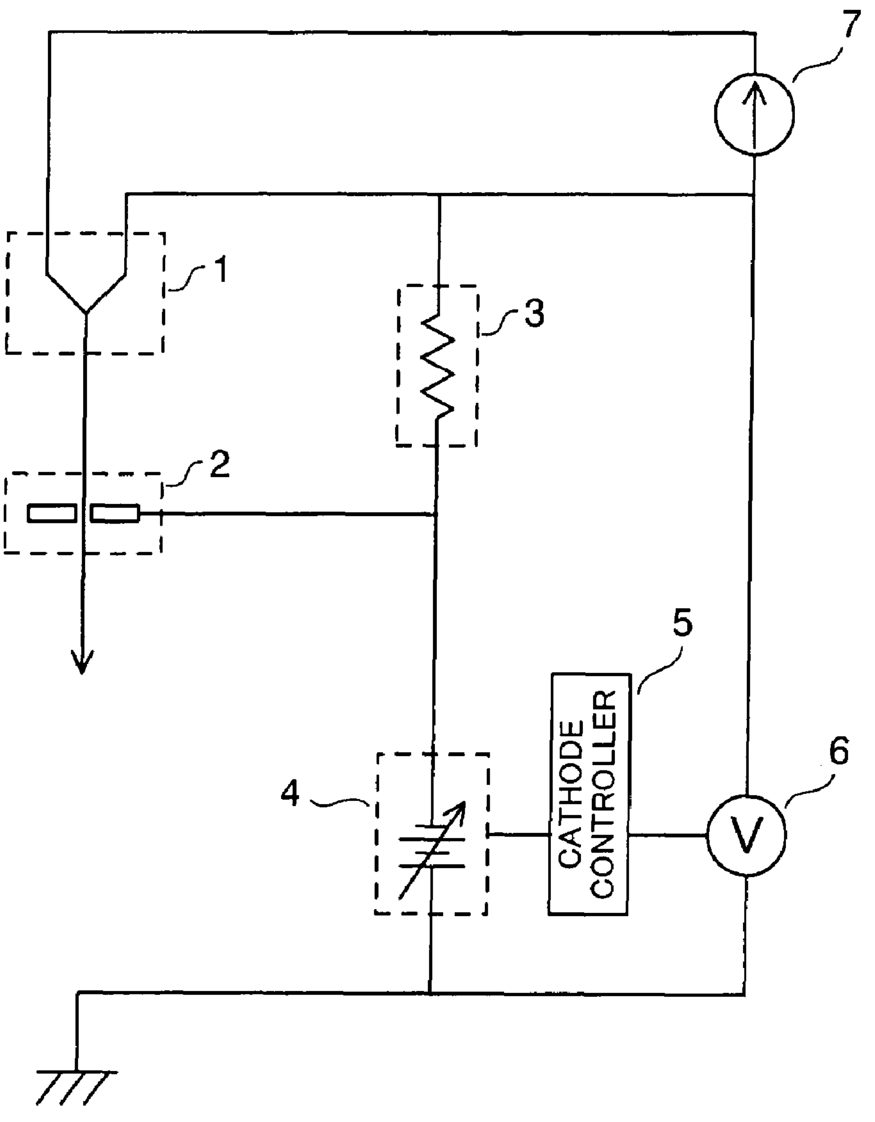
FIG. 1 is a diagram illustrating an electron beam generator of a conventional type.

Descriptions will be provided below for an embodiment of the present invention by referring to the drawings.

To begin with, descriptions will be provided for a configuration of a multiple-column electron beam exposure system which is used in this embodiment. Subsequently, descriptions will be provided for an electron beam generator for multiple columns. Finally, descriptions will be provided for an example in which an electron beam generator for a single column is applied to the multiple-column electron beam exposure system.

(Configuration of Multiple-column Electron Beam Exposure Sytem)

Figure 2:
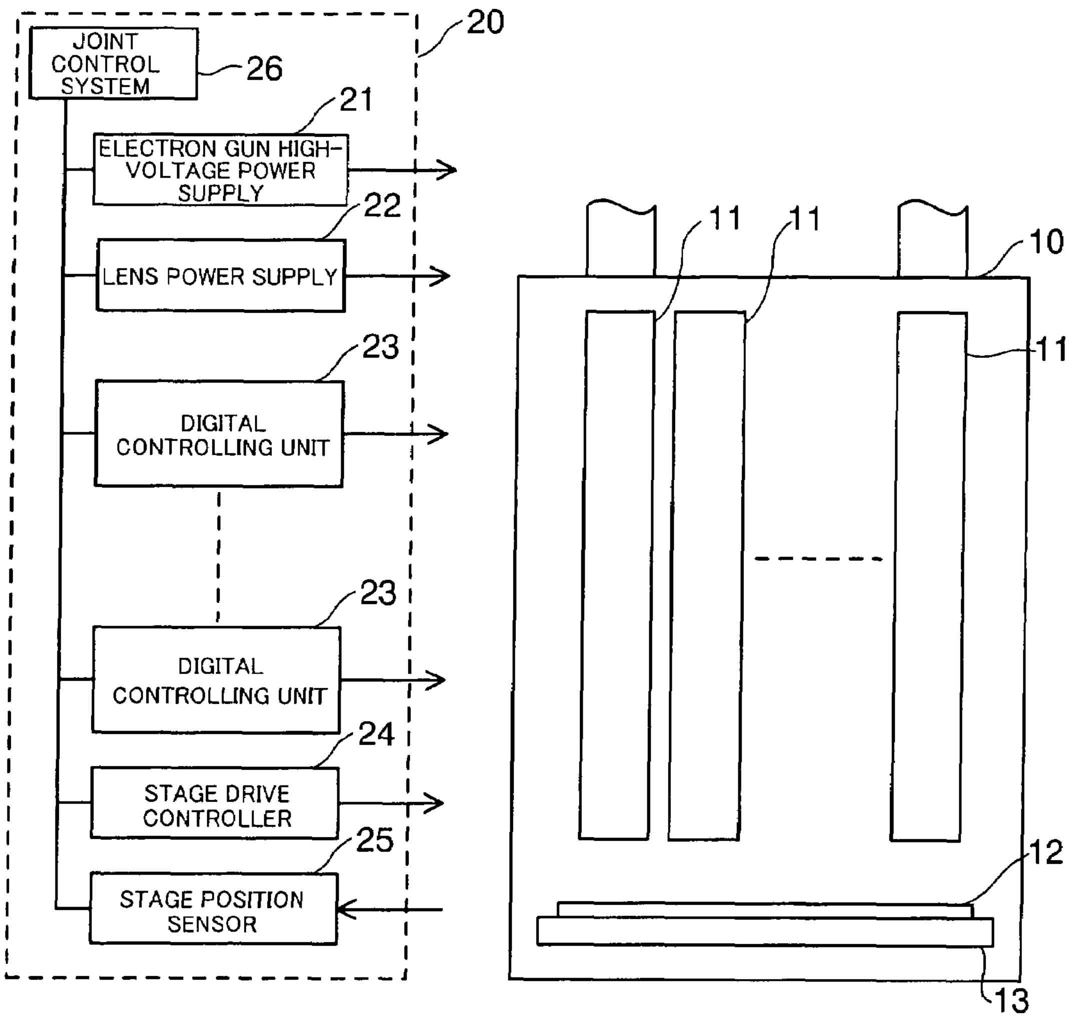
FIG. 2 is a diagram of a configuration of a multiple-column electron beam exposure system according to the present invention.

FIG. 2 is a diagram of a schematic configuration of the multiple-column beam exposure system according to the embodiment.

The multiple-column electron beam exposure system is roughly divided into an electron beam column 10 and a control module 20 for controlling the electron beam column 10. Out of the two, the electron beam column beam 10 as a whole is configured of a plurality of similar column cells 11. All of the column cells 11 are configured of the same units which will be described later. A wafer stage 13 on which, for example, a 300-mm wafer 12 is mounted is arranged under the column cells 11.

On the other hand, the control module 20 includes an electron gun high-voltage power supply 21, a lens power supply 22, digital controlling units 23, a stage drive controller 24 and a stage position sensor 25. Out of them, the electron gun high-voltage power supply 21 supplies power for the purpose of driving electron guns of the respective column cells 11 in the electron beam column 10. The lens power supply 22 supplies power for the purpose of driving electromagnetic lenses of each of the column cells 11 in the electron beam column 10. Each of the digital controlling units 23 is an electric circuit for controlling a corresponding one of the column cells 11, and outputs a high-speed deflection output. The digital controlling units 23 are set up in the same number as the column cells 11 are set up. The stage drive controller 24 causes the wafer stage 13 to move in order for beams of electrons to be irradiated on the wafer 12 at the respective desired positions on a basis of position information from the stage position sensor 25. The foregoing components 21 to 25 are controlled jointly by a joint control system 26 such as a workstation.

In the case of the foregoing multiple-column electron beam exposure system, every column cell 11 is constructed of a column unit of the same configuration.

Figure 3:
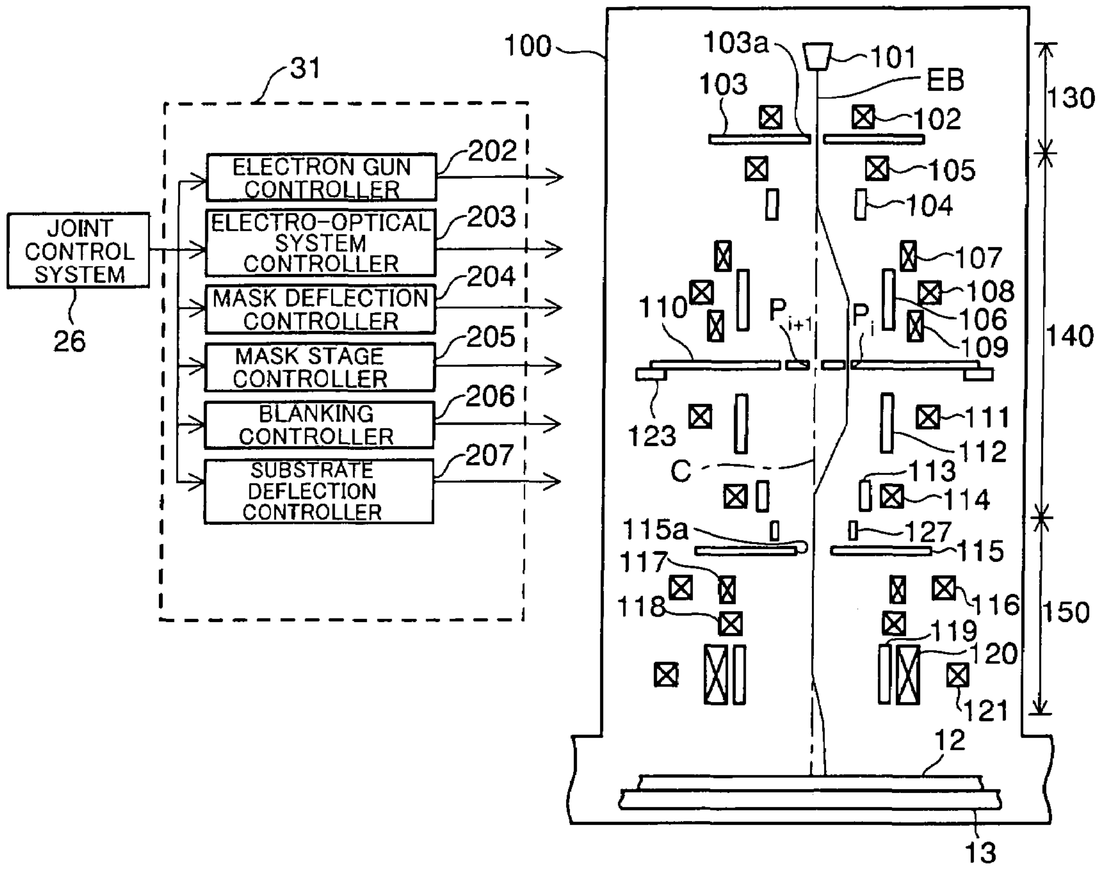
FIG. 3 is a diagram of a configuration of a column cell of the exposure system as shown in FIG. 1.

FIG. 3 is a diagram of a configuration of each column cell 11 used in the multiple-column electron beam exposure system.

Each of the column cells 11 is roughly divided into an exposure module 100 and a column cell control module 31 for controlling the exposure module 100. Out of these, the exposure module 100 is configured of an electron-beam generating module 130, a mask deflection module 140 and a substrate deflection module 150.

In the electron-beam generating module 130, a beam of electrons EB is generated by an electron gun of an electron beam generator 101. A first electro-magnetic lens 102 causes the beam of electrons EB to undergo a convergence effect. Thereafter, the resultant beam of electrons EB is transmitted through a rectangular aperture 103*a* of a beam shaping mask 103. Thus, the cross-section of the beam of electrons EB is shaped into a rectangle.

Subsequently, the beam of electrons EB forms an image on an exposure mask 110 by use of a second electromagnetic lens 105 in the mask deflection module 140. Thereafter, first and second electrostatic deflectors 104 and 106 deflect the beam of electrons EB to a specific pattern P formed in the exposure mask 110. Thus, the cross-section of the beam of electrons EB is shaped into the same form as the pattern P.

Note that, although the exposure mask 110 is fixed to a mask stage 123, the mask stage 123 is capable of moving in the horizontal plane. In a case where the pattern P existing in a part beyond a deflection range (beam deflection area) of the first and second electrostatic deflectors 104 and 106 is intended to be used, the mask stage 123 is moved, and thereby the pattern P is moved into the beam deflection range.

Third and fourth electro-magnetic lenses 108 and 111 are arranged respectively above and under the exposure mask 110. The third and fourth electro-magnetic lenses 108 and 111 play a role of causing the beam of electrons EB to form an image on the substrate by controlling the electric current amount of each of the electro-magnetic lenses.

Deflection effect of the third and fourth electro-magnetic lenses 108 and 111 swings back the beam of electrons EB, which has passed through the exposure mask 110, to an optical axis C. Thereafter, a fifth electromagnetic lens 114 reduces the beam of electrons EB in size.

The mask deflection module 140 is provided with first and second correction coils 107 and 109. The first correction coil 107 corrects deflection aberration which is generated by the first to second electrostatic deflectors 104 and 106, and the second correction coil 109 corrects deflection aberration which is generated by the third to fourth electrostatic deflectors 112 and 113.

Subsequently, the beam of electrons EB passes through an aperture 115*a* of a shielding plate 115 constituting the substrate deflection module 150. Thereafter, the beam of electrons EB is projected on the substrate by first and second projection electro-magnetic lenses 116 and 121. Thereby, an image of the pattern of the exposure mask 110 is transferred onto the substrate with a predetermined reduction ratio, for example, with a 1/60 reduction ratio.

The substrate deflection module 150 is provided with a fifth electrostatic deflector 119 and an electro-magnetic deflector 120. These deflectors 119 and 120 deflect the beam of electrons EB. Thus, the image of the pattern of the exposure mask is projected on the substrate at a predetermined position.

The substrate deflection module 150 is further provided with third and fourth correction coils 117 and 118 for correcting deflection aberration of the beam of electrons EB on the substrate.

On the other hand, the column cell control module 31 includes an electron gun controller 202, an electro-optical system controller 203, a mask deflection controller 204, a mask stage controller 205, a blanking controller 206 and a substrate deflection controller 207. Out of these, the electron gun controller 202 controls an acceleration voltage of the beam of electrons EB, a beam irradiation condition and the like. The electro-optical system controller 203 controls an amount of electric current flowing to each of the electromagnetic lenses 102, 105, 108, 111, 114, 116 and 121. Thus, the electro-optical system controller 203 adjusts a magnification, a focal point and the like of the electro-magnetic system where these electro-magnetic lenses are configured. The blanking controller 206 controls a voltage applied to a blanking electrode 127. Thus, the blanking controller 206 deflects the beam of electrons EB, which has been generated before the exposure operation starts, onto the shielding plate 115, and accordingly prevents the beam of electrons EB from being irradiated on the substrate before the exposure operation.

The substrate deflection controller 207 controls a voltage applied to the fifth electrostatic deflector 119 and an amount of electric current flowing to the electro-magnetic deflector 120. Thereby, the substrate deflection controller 207 deflects the beam of electrons EB onto the substrate at a predetermined position. The foregoing components 202 to 207 are controlled jointly by the joint control system 26 such as the workstation.

(Electron Beam Generator for Multiple Columns)

Figure 4:
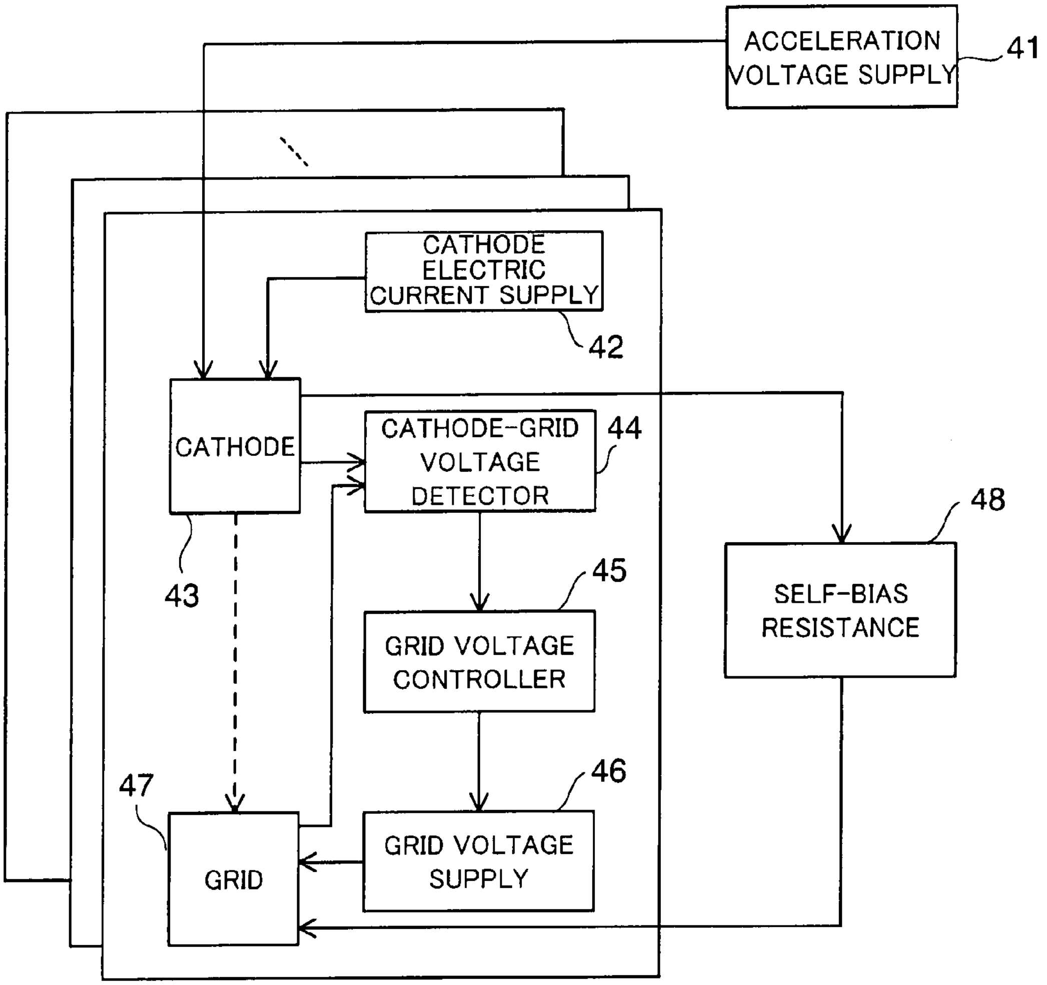
FIG. 4 is a diagram of a schematic configuration of an electron beam generator.

FIG. 4 is a diagram of a schematic configuration of the electron beam generator 101 for multiple columns according to the present invention. The electron beam generator 101 for multiple columns includes a single acceleration voltage supply 41 and a single self-bias resistance 48 which are common among all of the columns. In addition, the electron beam generator 101 for multiple columns include a cathode 43, a cathode electric current supply 42, a grid 47, a cathode-grid voltage detector 44, a grid voltage controller 45 and a grid voltage supply 46 for each of the columns.

The cathode electric current supply 42 supplies a cathode electric current to the cathode 43, and thus heats the cathode 43, accordingly causing the cathode 43 to generate thermoelectrons. The acceleration voltage supply 41 is a voltage supply common among all of the columns. The acceleration voltage supply 41 applies an acceleration voltage to each of the cathodes 43, and thus causes the generated thermoelectrons to be emitted from the cathode 43. An emission electric current flows in each of the cathodes 43 on the basis of the thermoelectrons emitted therefrom. The cathode-grid voltage detector 44 detects a voltage between the cathode and the grid, and thus informs the grid voltage controller 45 of the voltage value. On the basis of the voltage value which the grid voltage controller 45 has been informed of, the grid voltage controller 45 controls the value of a voltage which the grid voltage supply 46 applies to the grid 47. The emission electric current flows to the self-bias resistance 48 common among all of the columns. On the basis of the emission electric current flowing through the self-bias resistance 48, the self-bias resistance 48 drops the voltage applied to the cathode 43, and applies the resultant voltage to the grid. The electric potential of the grid 47 relative to the electric potential of the cathode 43 is determined on the basis of the voltage drop caused by the self-bias resistance 48 or the voltage which the grid voltage supply 46 applies to the grid 47.

By referring to FIG. 5, descriptions will be provided below for how the electron beam generator for multiple columns operates in a case where the emission electric current fluctuates, specifically, (1) in a case where the emission current fluctuates for a long period of time, and (2) in a case where the emission current fluctuates temporarily.

Figure 5:
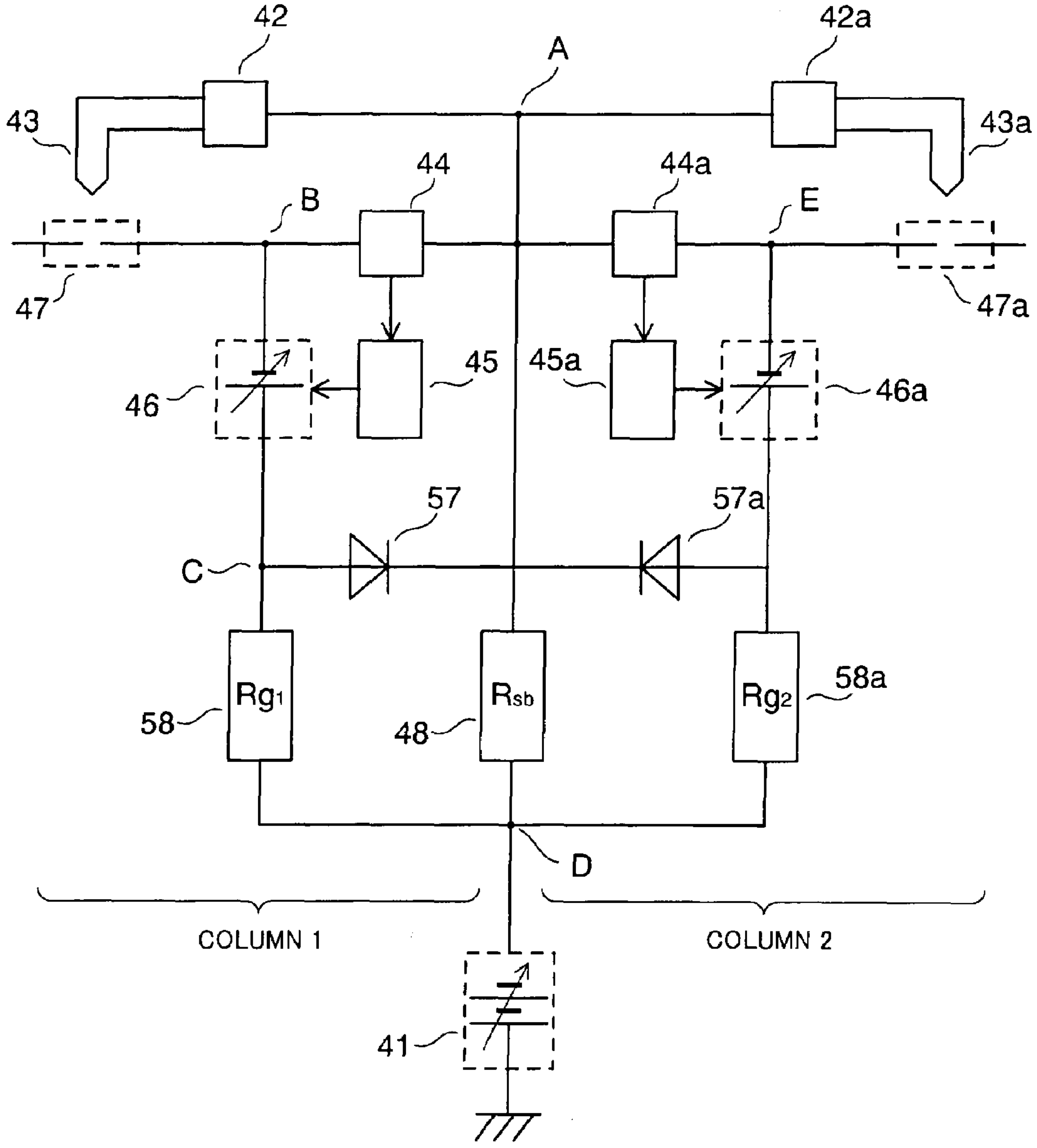
FIG. 5 is a diagram of a configuration of the electron beam generator according to the present embodiment.

(1) In a Case Where the Emission Electric Current Fluctuates for a Long Period of Time:

FIG. 5 is a diagram showing an example of a configuration of the electron beam generator for multiple columns according to the present invention. In the case of this embodiment, descriptions will be provided for the operation of the electron beam generator for multiple columns which has two columns.

The electron beam generator for multiple columns includes a cathode 43, a cathode electric current supply 42, an acceleration voltage supply 41, a grid 47, a grid voltage supply 46, a cathode-grid voltage detector 44, a grid voltage controller 45, a self-bias resistance 48, a diode (an electric current direction restricting element) 57 and a grid resistance 58. The cathode 43 generates thermoelectrons. The cathode electric current supply 42 supplies a cathode electric current to the cathode 43, and thus heats the cathode 43, accordingly causing the cathode 43 to generate the thermoelectrons. The acceleration voltage supply 41 applies a negative voltage to the cathode 43, and thus causes the cathode 43 to emit the thermoelectrons. The grid 47 converges the thermoelectrons emitted from the cathode 43, and thus forms a beam of electrons. The grid voltage supply 46 gives a grid 47 an electric potential obtained by applying the negative voltage relative to the electric potential of the cathode 43. The cathode-grid voltage detector 44 detects the voltage between the cathode 43 and the grid 47. On the basis of the voltage between the cathode 43 and the grid 47 which the cathode-grid voltage detector 44 has detected, the grid voltage controller 45 controls a voltage which the grid voltage supply 46 applies to the grid 47. On the basis of change of the emission electric current, the self-bias resistance 48 changes the electric potential of the grid 47 relative to the electric potential of the cathode 43, and thus inhibits the change in the emission electric current. The diode 57 is connected to the positive electrode (point C) of the grid voltage supply 46 as an anode side, and to a cathode electric potential point (point A) of the electron gun as a cathode side. The grid resistance 58 is connected between the anode side (point C) of the diode 57 and the negative electrode (point D) of the acceleration voltage supply 41.

Note that the electric potential of point A in FIG. 5 is a cathode electric potential common among all of the columns. By detecting the voltage between the reference potential (earth potential) and the electric potential at point A, control is made so that a cathode electric potential (Vacc) may be kept constant.

In addition, a control circuit for controlling the grid electric potential is configured of the cathode-grid voltage detector 44, the grid voltage controller 45, the self-bias resistance 48, the diode 57 and the grid resistance 58.

The case where the emission electric current fluctuates for a long period of time means, for example, a case where the beam of electrons fluctuates due to deterioration of the cathode and the like, and a case where the grid voltage controller 45 controls the grid voltage supply 46 by causing the cathode-grid voltage detector 44 to detect the voltage between the cathode and the grid.

Suppose that the following situation occurs in a column 1 as shown in FIG. 5: the voltage between the cathode and the grid is detected by the cathode-grid voltage detector 44; thus, the grid voltage controller 45 determines that the detected voltage fluctuates; and the grid voltage controller 45 accordingly changes the value of the grid power supply 46. A grid electric current Ig1 supplied by the grid voltage supply 46 passes through points B and C, passes through point A via the diode 57, and thus flows to the cathode 43 of the electron gun. In this manner, little of the grid electric current Ig1 flows to the self-bias resistance 48. Consequently, the electric potential at the negative electrode (point D) of the acceleration voltage supply 41 is represented by Vacc−Rsb×Ie, where Ie denotes the emission electric current which flows from the cathode 43, passes through point A, and subsequently flows through the self-bias resistance 48. The electric potential at the negative electrode of the acceleration voltage supply 41 no longer depends on the grid electric current Ig1.

In other words, the electric potential at the negative electrode (point D) of the acceleration voltage supply is represented by Vacc−Rsb×Ie, and remains unchanged, even though the cathode-grid voltage detector 44 detects the voltage between the cathode and the grid, the value of the grid voltage supply 46 is changed so as to inhibit the change of the voltage between the cathode and the grid, and consequently the grid electric current Ig1 changes. For this reason, there is no change in the electric current flowing through the self-bias resistance 48. This never changes the grid voltage supply 46*a* in the column 2.

This makes it possible to adjust the grid voltage in the column 1 independently without affecting the column 2.

In the case where the emission electric current fluctuates for a long period of time, the change in the beam of electrons is capable of being adjusted in each column in this manner. This makes it possible to supply a stable emission electric current.

Note that the grid electric current flowing to the self-bias resistance 48 is represented by Vth/(Rg1+Rsb), where Vth denotes a threshold voltage of the diode 57, and Rg1 denotes the value of the grid resistance 58. As a result, if the value Rg1 of the grid resistance 58 takes on a large number, the grid electric current can be ignored.

With respect to this embodiment, the foregoing descriptions have been provided for the configuration in which the diode 57 is used in the control circuit for controlling the grid electric current. However, what is used in the control circuit is not limited to the diode. For example, a varistor may be used in the control circuit as long as it is an element which restricts the direction of the electric current.

(2) In a Case Where the Emission Electric Current Fluctuates Temporarily:

The case where the emission electric current fluctuates temporarily means, for example, a case where electric discharge or the like occurs in the column cell, the emission electric current accordingly fluctuates for too short a period of time to change the value of the grid voltage supply.

In a case where electricity is discharged in the column 1 as shown in FIG. 5 and consequently the emission electric current increases by ΔIe, the electric current flowing through the self-bias resistance 48 is represented by Ie+ΔIe. Even if the cathode-grid voltage detector 44 detects change in voltage, the emission electric current increases by ΔIe at a brief moment. For this reason, the grid electric current is not capable of being adjusted while the emission electric current is increasing by ΔIe.

In other words, when the emission electric current increases temporarily in the column 1, the electric current flowing through the self-bias resistance 48 increases by ΔIe, and the electric potential at the negative electrode (point D) of the acceleration voltage supply is represented by Vacc−Rsb×(Ie+ΔIe). In addition, the electric potential at point B is represented by −Vg−Rsb×ΔIe, and an operation of decreasing ΔIe occurs. This is because the grid voltage controller. 45 is not capable of returning the grid voltage to the constant level while ΔIe is occurring, and because the electric potential at point A is fixed at Vacc.

In this case, both the grid voltage at the negative electrode (point B) in the column 1 and the grid voltage at the negative electrode (point E) in the column 2 are represented by −Vg−Rsb×ΔIe because of voltage drop which occurs at the two ends of the self-bias resistance 48. This causes an operation of decreasing ΔIe. This decreases ΔIe not only in the column where ΔIe has occurred, but also in the other columns. This decrease makes it possible to prevent damage of the mask and an equivalent problem, which would otherwise be caused by increase in beams of electrons.

In the case of the multiple-column electron beam exposure system according to this embodiment, the electron beam generator has the diode 57 which is connected between the grid voltage supply 46 and the cathode of the electron gun, and the self-bias resistance 48 which is connected between the cathode of the diode 57 and the negative electrode of the acceleration voltage supply. 41, as described above. This configuration makes it possible to prevent the grid electric current, which has been controlled so as to keep the voltage between the cathode and the grid constant, and which is supplied by the grid voltage supply, from flowing through the self-bias resistance 48, and to thus adjust the grid voltage in each column independently of the other columns. This makes it possible to supply a stable emission electric current to each column.

In addition, the temporary increase of the emission electric current is capable of being inhibited, because the voltage drop which occurs in the self-bias resistance 48 changes the grid electric potential of every column. This makes it possible to prevent damage of the mask and an equivalent problem, which would otherwise be caused by abnormal increase of the emission electric current.

COMPARATIVE EXAMPLE

Figure 6:
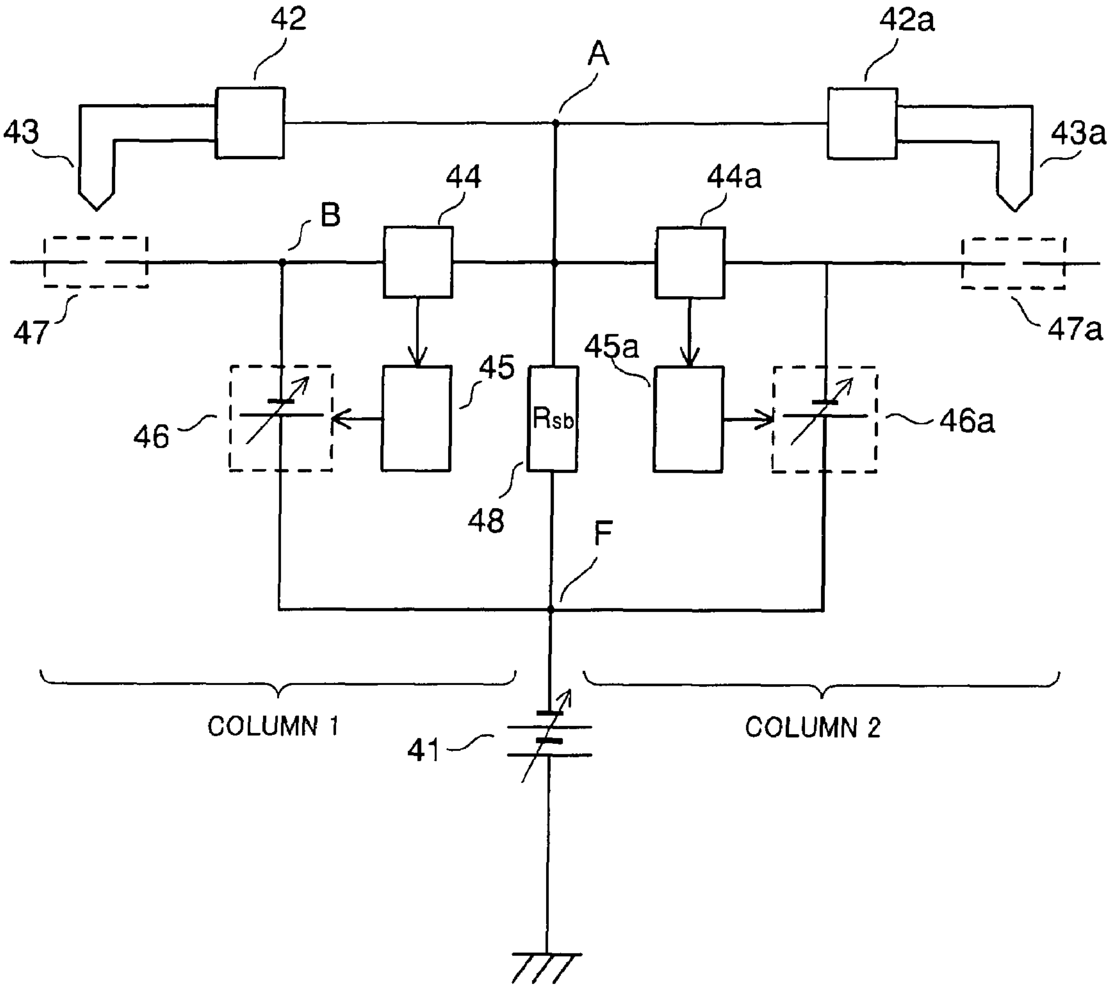
FIG. 6 is a diagram of a configuration of an electron beam generator according to a comparative example.

FIG. 6 shows an example where configurations each using a self-bias resistance 48 for stabilizing an emission electric current in a single column are applied to multiple columns.

In FIG. 6, Ig1 denotes a grid electric current which is supplied by a grid voltage supply 46 in a column 1; Ig2, a grid electric current which is supplied by a grid voltage supply 46*a* in a column 2; and Ie, an emission electric current. Suppose that the emission electric current of a cathode 43 takes on a larger electric current value because of electric discharge or the like. The emission electric current flows through a self-bias resistance 48, and causes voltage drop between the two ends of the self-bias resistance 48. A grid voltage controller 45 tries to return the emission electric current to a constant level by controlling the value of the grid voltage supply 46. However, the grid voltage controller 45 is not capable of responding to the emission electric current while the ΔIe is flowing. As a result, the grid voltage controller 45 is not capable of changing the value of the grid voltage supply 46. In this case, the electric potential of a grid 47 (point B) relative to the electric potential of the cathode 43 is represented by −Vg−Rsb×ΔIe, and thus an operation of decreasing the ΔIe occurs.

Emission electric currents of the columns 1 and 2 as well as grid electric currents of the columns 1 and 2 flow through the self-bias resistance 48. The electric potential at the negative electrode (point F) of an acceleration voltage supply is represented by Vacc−Rsb×(Ie−Ig1−Ig2). Suppose that change in the voltage between the cathode and the grid in the column 1 is detected, and that the value of the grid voltage supply 46 is thus intended to be controlled in order to inhibit the change. In this case, the electric current flowing to the self-bias resistance 48 changes. The electric potential at the negative electrode (point F) of an acceleration voltage supply 41 is represented by Vacc−Rsb×(Ie−Ig1−ΔIg1−Ig2), where ΔIg1 denotes the change of the grid electric current Ig1.

Because the electric current flowing to the self-bias resistance 48 changes, an operation is made in order to change the value of the grid voltage supply 46*a* in the column 2 as well. In other words, the value of the grid voltage supply 46*a* is changed in the column 2, although the emission electric current need not be changed in the column 2. For this reason, the grid electric current Ig2 fluctuates in the column 2, and the electric current flowing to the self-bias resistance 48 changes. This change causes the grid voltage supply in the column 1 to operate once again in order to fluctuate the grid electric current. These operations repeatedly occur, and thus positive feedback occurs in both the grid voltage supply 46 in the column 1 and the grid voltage supply 46*a* in the column 2, hence causing the grid voltage supplies 46 and 46*a* to oscillate.

Figure 7A:
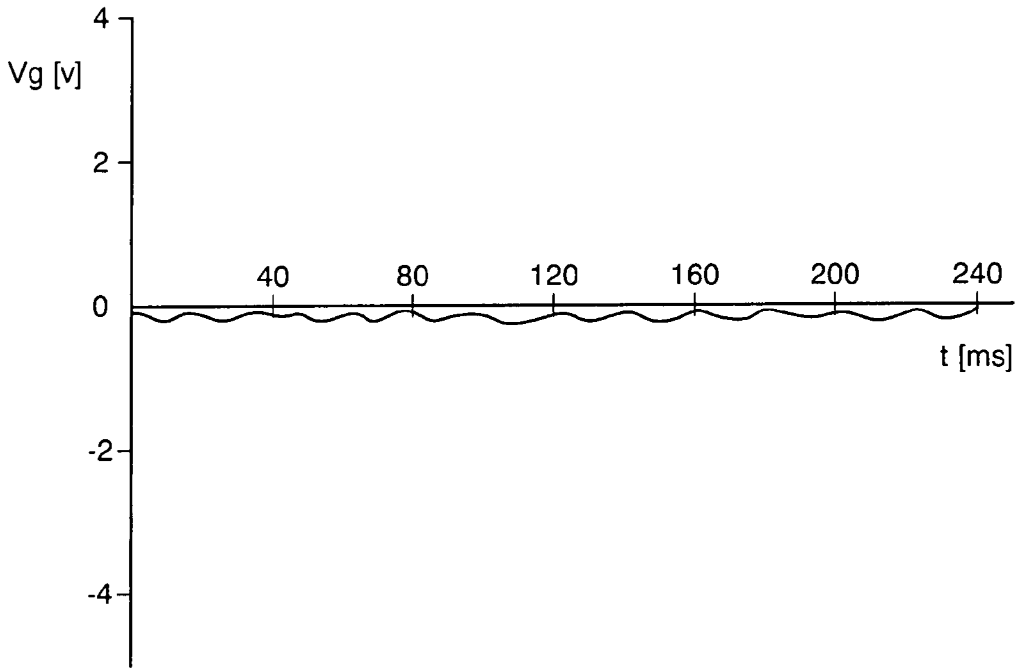
FIG. 7A is a diagram showing a waveform of a grid voltage which appears in a case where the electron beam generator as shown in FIG. 5 is used.
Figure 7B:
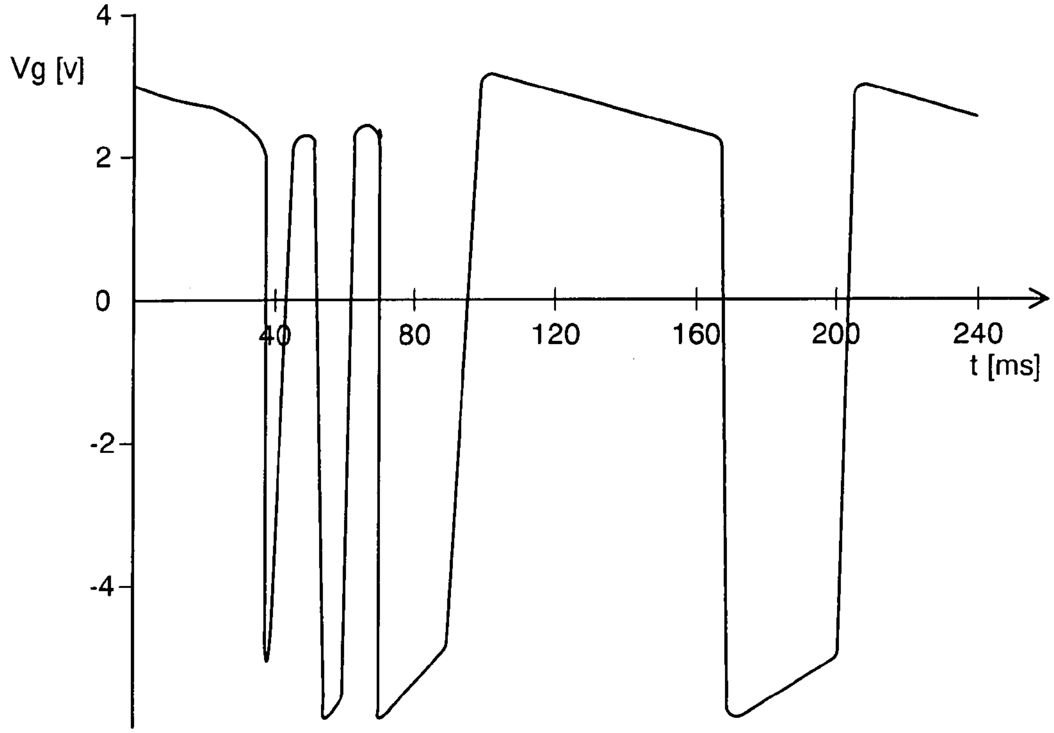
FIG. 7B is a diagram showing a waveform of a grid voltage which appears in a case where the electron beam generator as shown in FIG. 6 is used.

FIGS. 7A and 7B are diagrams each showing a waveform of a grid voltage. FIG. 7A shows a waveform of a grid voltage which appears when the electron beam generator according to the present invention is used. FIG. 7B shows a waveform of a grid voltage which appears when the electron beam generator described as the comparative example is used.

FIG. 7A shows that little change occurs in the grid voltage with respect to time. On the other hand, FIG. 7B shows that a maximum value and a minimum value of a permissible voltage of the grid voltage alternately appear with respect to time so that the grid voltage oscillates in a case where the configuration of the electron beam generator for a single column is applied to multiple columns. As a consequence, the configuration as the comparative example is not capable of supplying a stable emission electric current.

As described above, the electron beam generator for multiple columns according to this embodiment has the diode 57 which is connected between the grid voltage supply 46 and the cathode of the electron gun, and the self-bias resistance 48 which is connected between the cathode of the diode 57 and the negative electrode of the acceleration voltage supply 41. This configuration makes it possible to prevent the grid electric current, which has been controlled in order to keep the voltage between the cathode and the grid constant, and which is supplied by the grid voltage supply, from flowing to the self-bias resistance 48, and to thus adjust the grid voltage in each column independently of the other columns. This makes it possible to prevent the grid voltage supply 46 from oscillating, and to thus supply a stable emission electric current to each column.

In addition, in the case where the emission electric current increases temporarily, the voltage drop which occurs in the self-bias resistance 48 changes the grid electric potential in every column. This makes it possible to inhibit the emission electric current. This makes it possible to prevent damage of the mask and an equivalent problem, which would otherwise be caused by abnormal increase in the emission electric current.

Note that, although the foregoing descriptions have been provided for the case where the electron beam generator for multiple columns according to this embodiment is applied to the two columns, the number of columns to which the electron beam generator for multiple columns according to this embodiment is applied is not limited to two.

Although the foregoing descriptions have been provided for the electron gun configured to include the single grid, a grid for applying a positive potential to the cathode of each column may be further added on top of the grid which has been described with regard to this embodiment.

Moreover, the foregoing descriptions have been provided for this embodiment by citing the case where the electron beam generator for multiple columns is applied to the electron beam exposure system. However, what the electron beam generator for multiple columns can be applied to is not limited to the electron beam exposure system. The electron beam generator for multiple columns can be applied to a pattern inspection system and the like, as long as they are concerned with a multiple column electron beam system.

What is claimed is:

1. An electron beam generator for multiple columns comprising:
- a plurality of cathodes, to which a single acceleration voltage supply applies a negative acceleration voltage, and which thus generates thermoelectrons;
- a grid for each of the plurality of cathodes, the grid converging the thermoelectrons emitted from the cathode to form a beam of electrons;
- a grid voltage supply for each of the plurality of cathodes, the grid voltage supply giving the grid an electric potential which is negative relative to an electric potential of the cathode; and
- a control circuit for each of the plurality of cathodes, the control circuit, connected to the acceleration voltage supply, for controlling the electric potential of the grid,
- wherein the control circuit includes an electric current direction restricting element connected between a positive electrode of the grid voltage supply and the cathode, and wherein the grid electric current supplied from the grid voltage supply is caused to flow to the cathode through the electric current direction restricting element.

2. The electron beam generator for multiple columns according to claim 1, wherein the control circuit further includes a voltage detector for detecting a voltage between the cathode and the grid, and a grid voltage controller for controlling a value of the grid voltage supply, on a basis of the voltage detected by the detector, and wherein when the grid voltage controller determines that the voltage between the cathode and the grid fluctuates, the grid voltage controller change the value of the grid voltage supply so as to inhibit the fluctuations.

3. The electron beam generator for multiple columns according to claim 1, wherein the control circuit further includes a self-bias resistance connected between a negative electrode of the acceleration voltage supply and the cathode, and wherein when an emission electric current increases due to the thermoelectrons emitted from the cathode, the electric potential of the grid is adjusted so as to decrease the emission electric current.

4. The electron beam generator for multiple columns according to claim 3, wherein the control circuit further includes a resistance element which is connected between the positive electrode of the grid voltage supply and a connection point between the negative electrode of the acceleration voltage supply and the self-bias resistance.

5. The electron beam generator for multiple columns according to claim 1, wherein the electric current direction restricting element is a diode or a varistor.

6. The electron beam generator for multiple columns according to claim 5, wherein an anode of the diode is connected to the positive electrode of the grid voltage supply.

* * * * *